United States Patent [19]

Suzuki et al.

[11] Patent Number: 5,400,282
[45] Date of Patent: Mar. 21, 1995

[54] DETECTOR CIRCUIT FOR TESTING SEMICONDUCTOR MEMORY DEVICE

[75] Inventors: Youichi Suzuki; Makoto Segawa, both of Yokohama; Toshiaki Ohno; Sumako Shiraishi, both of Kawasaki, all of Japan

[73] Assignee: Kabushiki Kaisha Toshiba, Kawasaki, Japan

[21] Appl. No.: 914,744

[22] Filed: Jul. 17, 1992

[30] Foreign Application Priority Data

Jul. 17, 1991 [JP] Japan ................... 3-177012

[51] Int. Cl.[6] ............................................. G11C 29/00
[52] U.S. Cl. .................................... 365/201; 365/233
[58] Field of Search ............... 361/201, 233, 230.08, 361/189.01

[56] References Cited

U.S. PATENT DOCUMENTS

| | | | |
|---|---|---|---|
| 4,751,679 | 6/1988 | Dehganpour | 365/201 |
| 4,954,994 | 9/1990 | Hashimoto | 365/201 |
| 5,086,413 | 2/1992 | Tsuboi | 365/230.08 |
| 5,111,433 | 5/1992 | Miyamoto | 365/201 |
| 5,151,881 | 9/1992 | Kajigaya | 365/201 |
| 5,257,231 | 10/1993 | Masuda | 365/201 |

*Primary Examiner*—Eugene R. LaRoche
*Assistant Examiner*—A. Zarabian
*Attorney, Agent, or Firm*—Foley & Lardner

[57] ABSTRACT

A semiconductor memory device having a normal mode of reading and writing data from and to a selected memory cell of a memory cell array. The semiconductor memory device is characterized by control means for switching the normal operation mode to a test mode in response to a test mode signal applied to a certain input terminal, selecting all desired memory cells of the memory cell array at a time, and allowing data applied to a data input terminal to be written to all the selected and desired memory cells at one time.

27 Claims, 17 Drawing Sheets

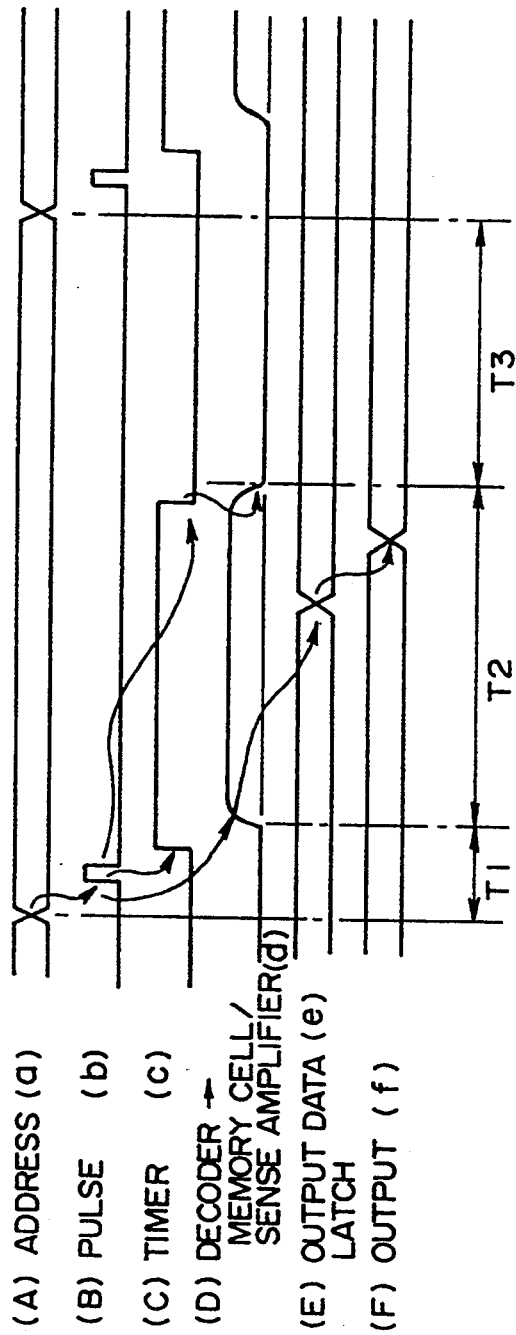
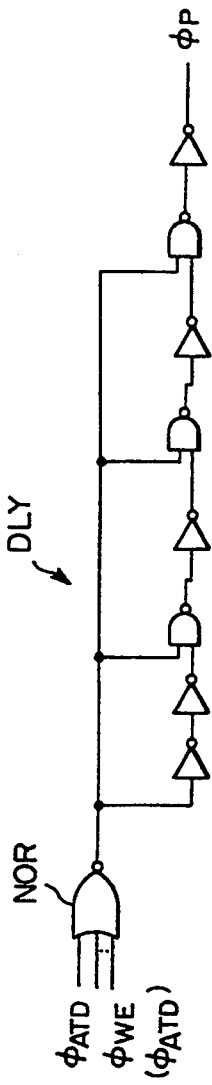
FIG. 20
FIG. 21 PRIOR ART

DETECTOR CIRCUIT FOR TESTING SEMICONDUCTOR MEMORY DEVICE

FIELD OF THE INVENTION

The present invention relates to a semiconductor memory device and a detector circuit to be used with the semiconductor memory device, suitable for application to static RAMs.

BACKGROUND OF THE INVENTION

In a static RAM, data is written to and read from a cell among a plurality of cells determined by an address. In a burn-in test for such a memory, i.e., in a test of applying stresses of "0" and "1" to all flip-flop cells at a high temperature, addresses are sequentially changed to select one cell after another to apply an electric field stress corresponding to data "0" and "1". In recent memory systems, in order to reduce power consumption, a power-down function is used, namely a closing a word line after a predetermined time lapse after each cell is selected. Therefore, even if a cell is selected by an address, the time period while the word line is actually opened is very short. This can be understood from a simple timing chart of selecting a cell, as shown in FIG. 18. Specifically, when an address transits (A), this transition is detected by an address transition detector (ATD) (B). A timer then starts operating (C) to activate a selected word line (D). Thereafter, the timer stops (C) to inactivate the selected word line. It takes a long time to apply stresses to all cells for a certain time period.

This problem will be further described in detail below. In a semiconductor memory (static RAM) having a timer circuit, a memory cell is activated for a time period predetermined by the timer circuit, for the data read/write. During the data read/write, each memory cell is activated only for the predetermined time period. Therefore, sufficient stress is not applied to a memory cell during a stress applying test (burn-in test or the like), as compared to the stress application to a memory cell without using such a timer circuit. For this reason, it becomes important to select an optimum test method in order to remove defective memory cells.

FIG. 19 shows a simplified system arrangement of a semiconductor memory (static RAM). This system operates in the following manner in order to reduce current consumption. Namely, data in a memory cell of a memory cell array MCA is stored via a sense amplifier SA in an output data latch circuit DLC. Thereafter, the decoder and sense amplifier SA are inactivated by using a timer circuit TC. The timer circuit TC determines the time period during which a memory cell is activated. The shorter the time period while the timer circuit TC activates the memory system, the more the power consumption reduces. However, the total stress test time becomes very long in order to apply sufficient stresses and reliably remove defective memory cells. It becomes therefore necessary to provide some alternative test method.

FIG. 20 Shows the operation during a read cycle of the static RAM shown in FIG. 19. Nodes a to f in FIG. 19 correspond to (A) to (F) shown in FIG. 20.

When an address (a) is fixed, a pulse (b) rises. When the pulse (b) rises, a decoder (d) and a timer (c) start operating. Data in a memory cell selected by an output from the decoder (d) is latched by an output data latch circuit (e), and the latched data is outputted (f). Thereafter, the timer (c) causes operations of the decoder and sense amplifier to stop.

As seen from FIG. 20, a memory cell inactive period T1 extends in time fixing from the address (a) to the time when the decoder (d) delivers an output, a memory cell active period T2 is from when the decoder (d) delivers an output to when the decoder (d) stops delivering its output, and another memory cell inactive period T3 is from when the decoder (d) stops delivering its output to when the next address (a) is fixed.

It is also possible during a write cycle to activate a memory cell for a predetermined time period by using the timer circuit TC. The operations of the timer circuit TC and decoder (d) are the same as during the read cycle.

FIG. 21 shows an example of a conventional timer circuit TC. The timer circuit TC receives $\phi_{ATD}$ (address transition detector output), $\phi_{WE}$ (WE output signal), $\phi_{DTD}$ (data transition detector output), and other signals, and sets a desired delay time using a delay circuit DLY.

A NOR-ed signal of the input signals to the timer circuit TC is delayed by the delay circuit DLY having inverters and NAND gates, to obtain an output $\phi_p$ for the control of the word line and sense amplifier.

The above-described problem of a long test time also becomes significant as the capacity of a memory increases. Namely, in a stress application test for memory cells of a semiconductor memory, cells are sequentially selected to apply stresses thereto. Therefore, it takes a very long time to apply sufficient stresses to all cells, as the capacity of the memory increases.

More specifically, data is read from and written into a memory cell among a plurality of memory cells of a semiconductor memory (static RAM) determined by inputted address signals. As the capacity of a memory increases and so the number of memory cells increases, there arises a problem of a very long time in applying sufficient stresses to all cells and removing defective cells during a stress application test.

As described above, a conventional semiconductor memory has the following disadvantages.

Namely, it takes a considerably long time to apply stresses to all memory cells during a burn-in test or the like, because stress is applied sequentially to one memory cell after another.

Furthermore, for a semiconductor memory having a power-down function with a memory cell active period being determined by a timer circuit, it is difficult to apply sufficient stress to each memory cell, because the memory cell active period is limited to a short time period.

SUMMARY OF THE INVENTION

The present invention has been made under the above-described circumstances. It is therefore an object of the present invention to provide a semiconductor memory device capable of testing in a simple manner.

It is another object of the present invention to provide a detector circuit suitable for use in testing a semiconductor memory.

A semiconductor memory device according to the first invention having a normal mode of reading and writing data from and to a selected memory cell of a memory cell array, comprises control means for switching an operation mode to a test mode in response to a test mode signal applied to a certain input terminal, selecting all desired memory cells of the memory cell array at a time, and allowing data applied to a data input terminal to be written to all the selected and desired memory cells at a time.

A semiconductor memory device according to the second embodiment of the invention having a normal mode of reading and writing data from and to a memory cell of a memory cell array selected and activated for a time period predetermined by a timer means, comprises control means for switching an operation mode to a test mode in response to a test mode signal applied to a certain input terminal, and delivering an output from the timer means as an activation signal for continuously activating the memory cell while the test mode signal is applied.

A semiconductor memory device according to the third embodiment of the invention has a normal mode of decoding an inputted address by a decoder to obtain a decoded signal, selecting a memory cell of a memory cell array by the decoded signal, and reading and writing data from and to the selected memory cell. It comprises control means for switching an operation mode to a test mode in response to a power source voltage higher than a predetermined value, delivering an output from the decoder as a selection signal for selecting a plurality of desired memory cells while the power source voltage is higher than the predetermined value, irrespective of the inputted address.

A semiconductor memory device according to the fourth embodiment of the invention having a normal mode of reading and writing data from and to a memory cell of a memory cell array selected and activated for a time period predetermined by a timer means, comprises control means for switching an operation mode to a test mode in response to a power source voltage higher than a predetermined value, and delivering an output from the timer means as an activation signal for continuously activating the memory cell while the power source voltage is higher than the predetermined value.

A detector circuit according to the fifth embodiment of the invention comprises: first and second low resistance elements connected in series between a high voltage power source and a low voltage power source; a third low resistance element, a switching element and a fourth low resistance element, connected in series between an input terminal and the low voltage power source; a connection circuit for connecting a junction point between the first and second low resistance elements and a control terminal of the switching element; and an output circuit extending from a junction point between the switching element and the fourth low resistance element.

According to the first invention, when a test mode signal is applied to a certain input terminal, the semiconductor memory device enters a test mode so that a desired memory cell or cells, e.g., all memory cells, of the memory cell array are selected. Data applied to a data input terminal is written in all the selected memory cells at a time.

According to the second invention, during the normal mode, the timer means activates a memory cell for a predetermined time period. While a test mode signal is applied to a certain input terminal, the semiconductor memory device enters a test mode. The timer means continuously activates a selected memory cell while the test mode signal is applied.

According to the third invention, during the normal mode the timer means activates a memory cell for a predetermined-time period. When the power source voltage is higher than a predetermined value, the semiconductor memory device enters a test mode. During the test mode, the timer means continuously activates a memory cell while the test mode signal is applied.

According to the fifth invention, when the power source voltage rises to a certain value, this voltage rise is detected by the first and second low resistance elements, and the switching element turns on. As a result, a current path having the third and fourth low resistance elements is formed between the input terminal and low voltage power source. In this state, when the potential of voltage applied to the input terminal rises to a certain value, this voltage rise is detected by the third and fourth resistance elements to deliver a signal to the output terminal.

According to the present invention, it is possible to test a semiconductor memory device in a very simple manner. Furthermore, an input voltage detector can be realized which provides no input leakage current within the range of the ordinary rated power source voltage and is not likely to generate a malfunction.

BRIEF DESCRIPTION OF THE DRAWINGS

FIG. 20 is a timing chart explaining the read cycle operation of the system shown in FIG. 19.

FIG. 21 shows an example of the timer circuit shown in FIG. 19.

DESCRIPTION OF THE PREFERRED EMBODIMENTS

In the first embodiment, when a predetermined bias potential is applied to a pad, e.g., an address pin, all memory cells are continuously selected at a time and the semiconductor memory device enters a write enable state. In this state, when a "Low" or "High" level is applied to an I/O pin, the "Low" or "High" level is written to all the cells at a time.

Namely, when a predetermined potential is applied to a certain pin, a mode different from a normal mode is selected and all cells are continuously selected at a time and the "Low" or "High" level can be written from the I/O pin. In this manner, in a burn-in test, electric field stresses can be applied to all memory cells at a time.

Figure 1:
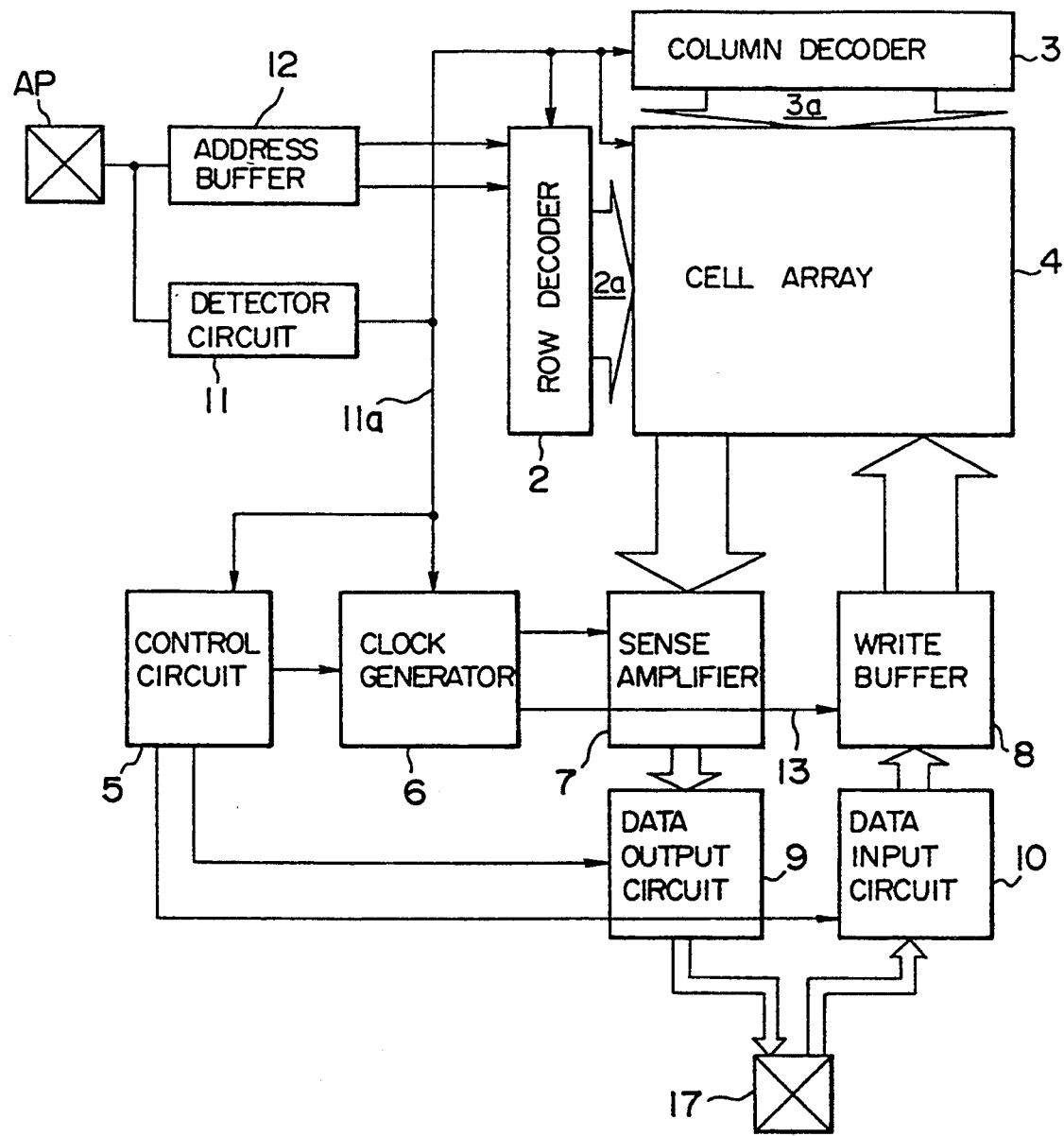
FIG. 1 shows a system arrangement of a first embodiment of the present invention.

The first embodiment of the present invention will be detailed with reference to FIGS. 1 to 3. FIG. 1 shows a system arrangement of an SRAM device having a test mode, FIG. 2 is a timing chart showing the operation of entering the test mode, and FIG. 3 is a detailed circuit diagram of an all-cell write circuit.

Figure 2:
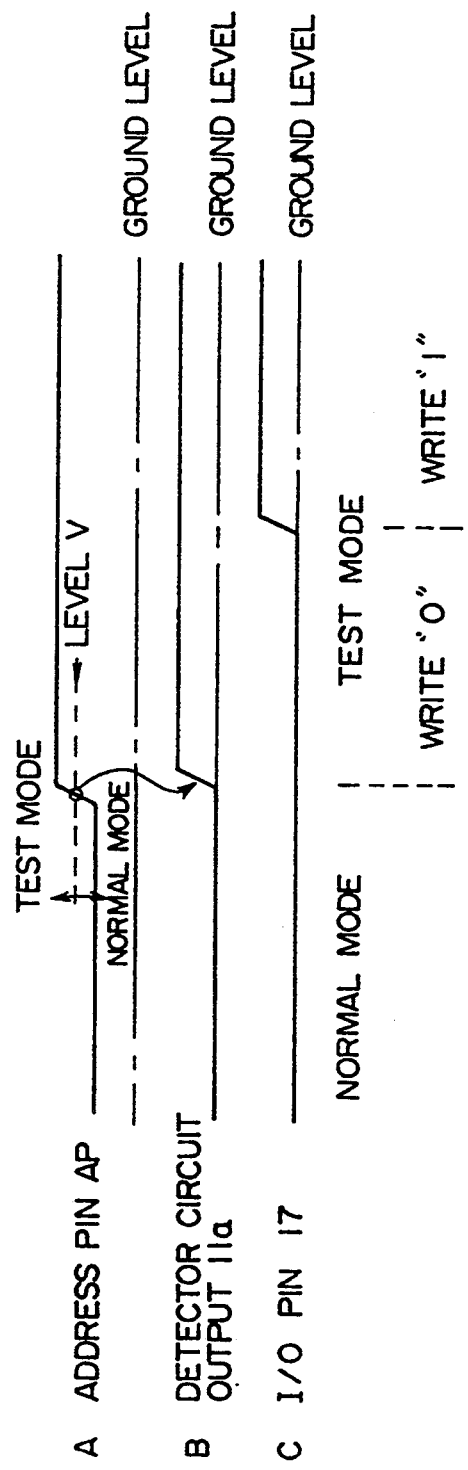
FIG. 2 is a timing chart showing the operation of the system shown in FIG. 1.

Connected to one of address pins AP shown in FIG. 1 are an address buffer 12 and a detector circuit 11 which changes its output 11a from "Low" (normal mode) to "High" (test mode) when an input voltage reaches a voltage level V (level V shown in FIG. 2). The voltage level V is outside the range of the ordinary rated operation voltage of the memory system, thereby giving no influence to the operation of the normal mode. When the address pin AP is raised to the voltage level V or more, the output 11a of the detector circuit 11 changes from "Low" to "High" to cause the memory system to enter the test mode. Namely, all cells are continuously set to the selection state and write enable state. When the output 11a becomes "High", a control circuit 5 enters the write enable state, and a clock generator 6 does not supply an equalizing pulse to a sense amplifier 7, but supplies an enable signal 13 to a write buffer 8. A row decoder 2 and column decoder 3 enable all their outputs, and all cells are activated. In order to prevent a flow of cell current, a normally-on load 16 on each bit line BL is disabled (refer to FIG. 3). After the above procedure, the memory system enters the test mode. If an I/O pin 17 is set to "Low" in this mode, "0" is written in all cells 15, and if "High", "1" is written. In this manner, both stresses "0" and "1" are applied to all cells 15.

Figure 3:
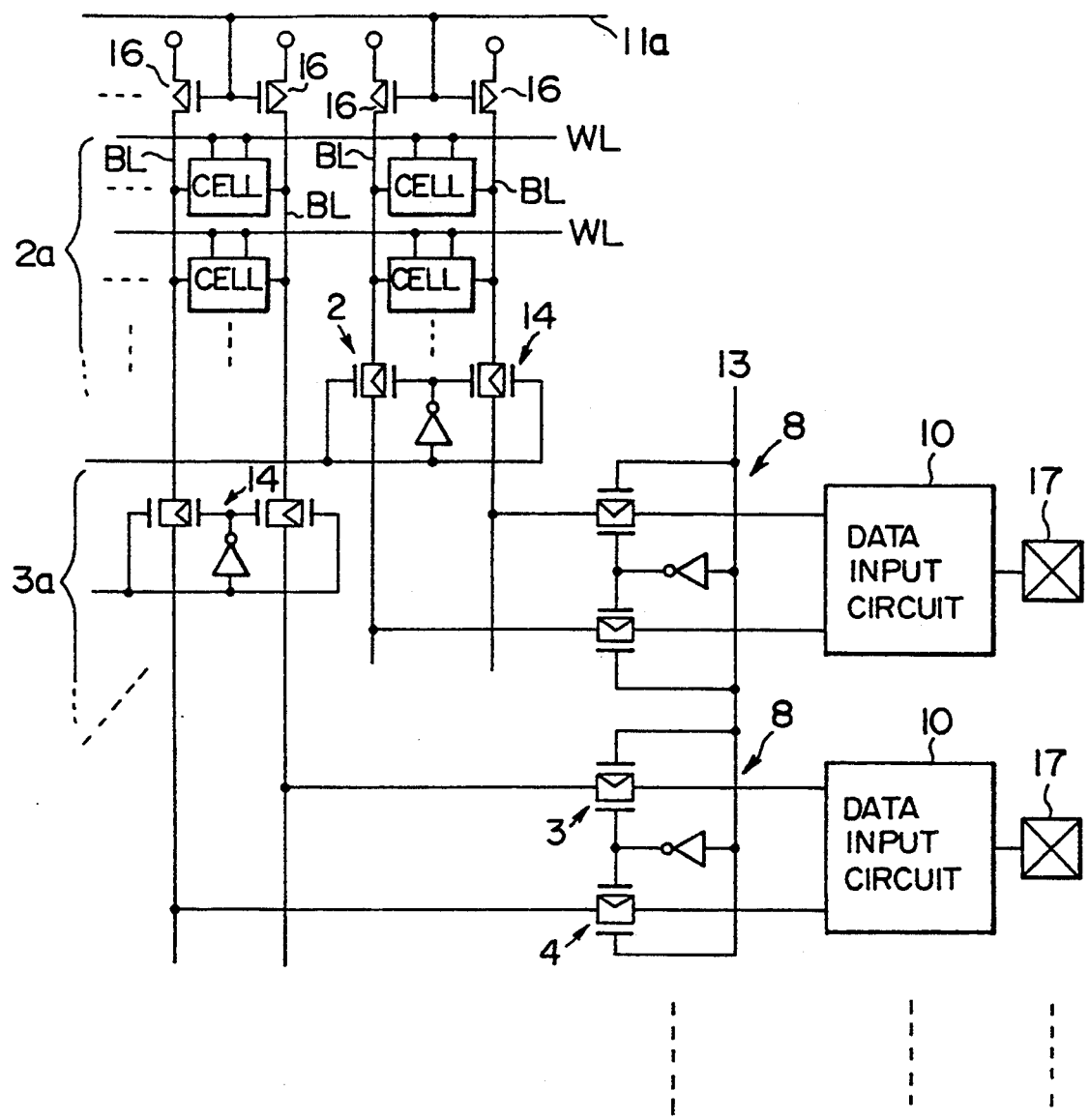
FIG. 3 is a detailed circuit diagram of an all-cell write circuit.

In FIGS. 1 and 3, reference numeral 4 represents a cell array, reference numeral 7 represents a sense amplifier, reference numeral 9 represents a data output circuit, reference numeral 10 represents a data input circuit, reference numeral 13 represents a write buffer enable signal, and reference numeral 14 represents a column switch.

It is also possible to arrange the embodiment such that the memory system enters the test mode when a detected power source voltage level takes a certain level. It is also possible to provide a dedicated pad to which a voltage level is applied to enter the test mode.

According to the embodiment of the memory system described above, given a predetermined bias potential, all cells are continuously set to the write enable state and written with data "0" or "1" at a time. It is therefore possible to considerably reduce the time required for a burn-in test or the like.

Next, the second embodiment will be described.

In the second embodiment, in a semiconductor memory having a timer circuit, depending upon the magnitude of a certain control signal, the operation of the timer circuit is controlled to take either a first operation state or a second operation state. In the first operation state, the normal mode is effected using ordinary control signals. In the second operation state, the timer circuit continuously outputs an activation signal independently from ordinary control signals. The control signal is an input voltage $V_{IN}$ to a voltage detector VDC. Depending upon whether this voltage $V_{IN}$ is larger or smaller than $V_A$, the operation state of the timer circuit is switched between the first and second operation states. The voltage level $V_A$ for $V_{IN} > V_A$ is outside the range of the ordinary rated input voltage of the memory system. Namely, within the ordinary use range (range of the ordinary rated input voltage), the timer circuit operates in a conventional manner to allow low power consumption. When a stress voltage is to be applied during a stress application test, selected memory cells are continuously activated during the test period, to thereby apply sufficient stresses.

The second embodiment of the present invention will be detailed with reference to the accompanying drawings.

Figure 4:
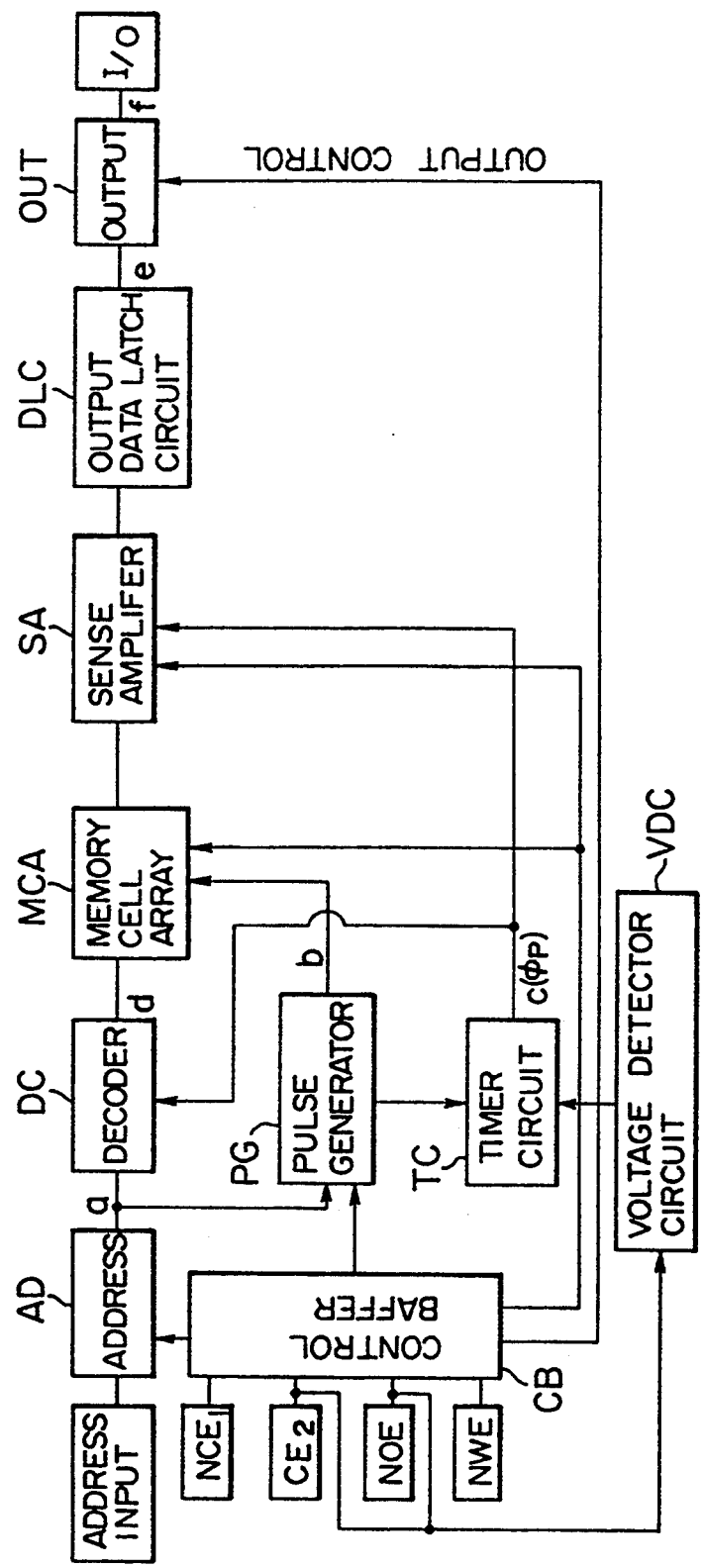
FIG. 4 shows a system arrangement of a second embodiment of the present invention.
Figure 19:
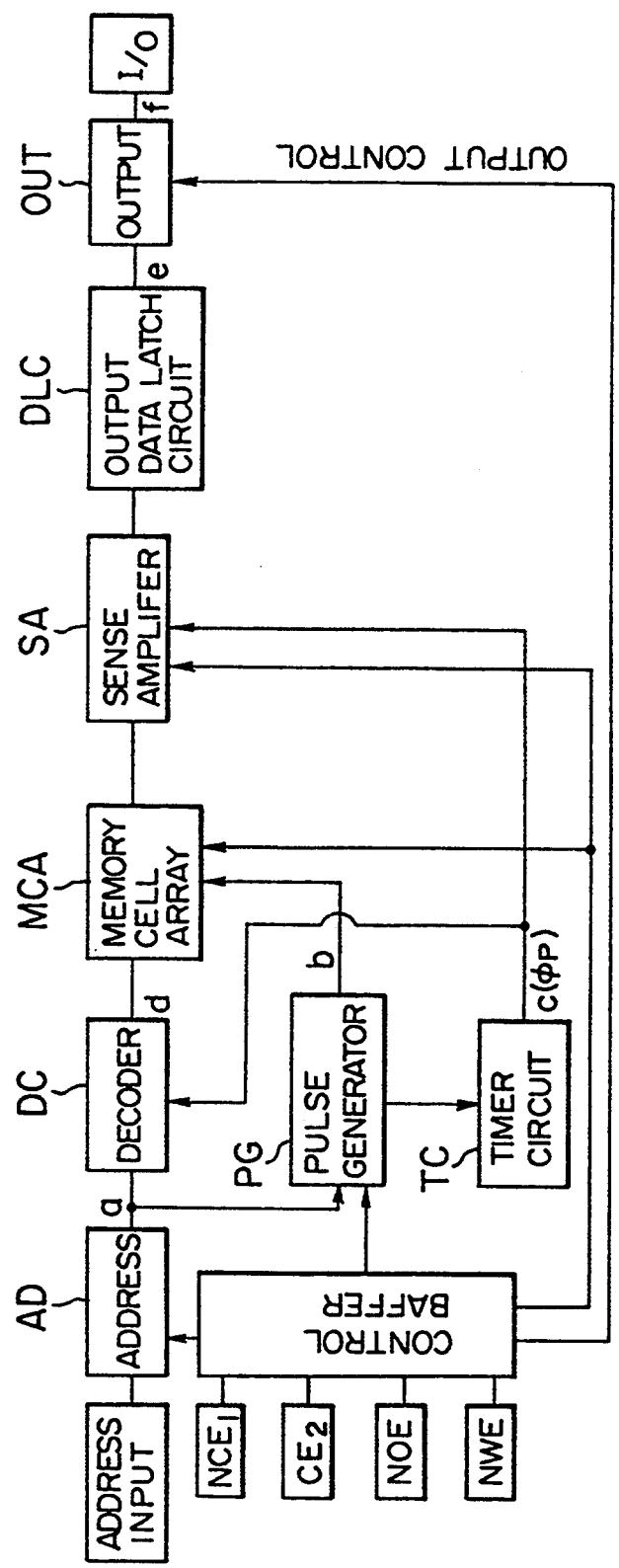
FIG. 19 is a system arrangement of a conventional SRAM.

FIG. 4 shows a system arrangement of the memory system during a read cycle. In FIG. 4, like elements of those shown in FIG. 19 are represented by using identical reference numerals. A different point from FIG. 19 is a provision of the voltage detector circuit VDC. An input voltage $V_{IN}$, signal NOE or $CE_2$, is applied to the circuit VDC. If this voltage $V_{IN}$ is lower than the predetermined value $V_A$, the timer circuit TC operates in the normal mode, whereas if higher, it continuously outputs an activation signal to activate a memory cell array MCA and sense amplifier SA.

Figure 5:
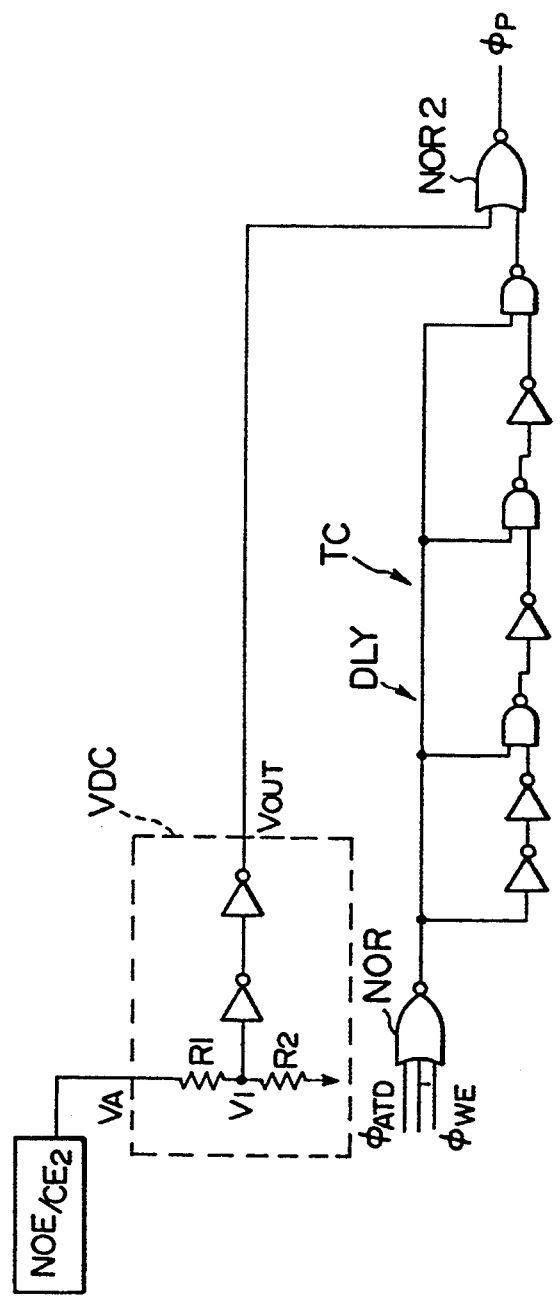
FIG. 5 is a detailed circuit showing part of the system shown in FIG. 4.

FIG. 5 is a detailed circuit diagram of the voltage detector circuit VDC connected to the timer circuit TC. In FIG. 5, like elements to those shown in FIG. 21 are represented by using identical reference numerals. The input voltage $V_{IN}$, signal NOE or $CE_2$, is divided by the voltage detector circuit VDC to obtain a voltage $V_1$ which is determined by the resistance ratio of resistors $R_1$ and $R_2$. The voltage $V_1$ is outputted as an output voltage $V_{OUT}$ via two cascaded inverters IV1 and IV2.

Figure 6:
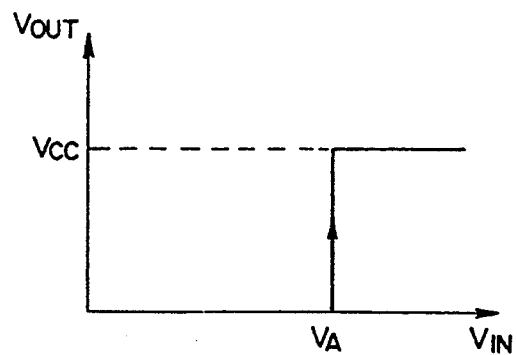
FIG. 6 is a graph showing the output characteristics of the voltage detector circuit shown in FIG. 4.
Figure 7:
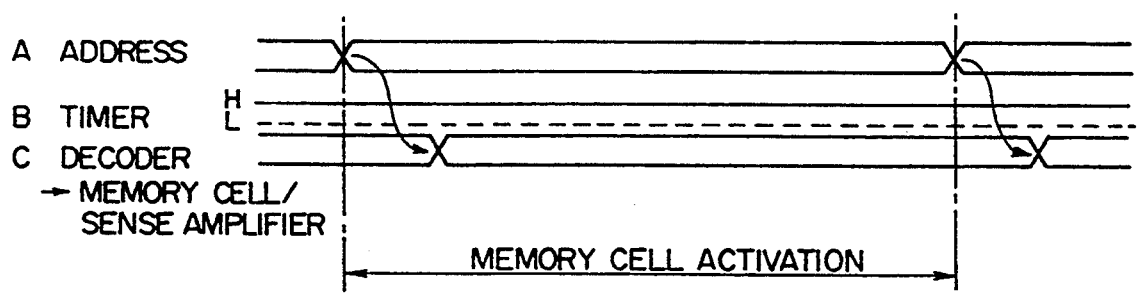
FIG. 7 is a timing chart showing a read cycle operation during $V_{IN} > V_A$ of the system shown in FIG. 4.

As seen from FIG. 6, $V_{OUT} = 0$ V for $V_{IN} < V_A$, and $V_{OUT} = V_{CC}$ for $V_{IN} > V_A$. The output $V_{OUT}$ is NORed by a NOR circuit NOR2 with an output of the timer circuit TC to obtain an output $\phi_p$. If $V_{IN} < V_A$, the output $\phi_p$ takes a value as determined from input signals $\phi_{ATD}$, $\phi_{WE}$ and the like to the timer circuit TC. If $V_{IN} > V_A$, the output $\phi_p$ continuously takes a constant potential independently from $\phi_{ATD}$, $\phi_{WE}$ and the like. Therefore, the output $\phi_p$ will not change and so the memory cell array MCA and sense amplifier SA are not inactivated, but they are continuously activated during this cycle. The output characteristics of the voltage detector circuit VDC are shown in FIG. 6. The operation during a read cycle for $V_{IN} > V_A$ is shown in FIG. 7. The operation for $V_{IN} < V_A$ is the conventional mode.

The voltage detector circuit VDC is connected to an output enable (NOE) pin or chip enable ($CE_2$) pin. When the circuit VDC is connected to the NOE pin, the output circuit OUT is in a disable state. However, the memory cell array MCA is in an ordinary activated state.

In the case of an E/R static RAM using high resistance elements, these high resistance elements may be used as the divider resistors of the voltage detector circuit VDC. Use of high resistance elements sufficiently lowers a leakage current between the input and ground of the voltage detector circuit VDC.

The voltage $V_1$ may be set by using transistors instead of divider resistors. The logical operation between the outputs of the voltage detector circuit and the timer circuit may be made at the input side of the timer circuit. The logical OR operation, as well as the AND operation, may be used to obtain the same operational result.

According to the second embodiment of the present invention described above, within the range of the ordinary rated operation, low power consumption is possible by using the timer circuit like a conventional memory system. During a stress application test, selected memory cells are not activated for a predetermined period within an operation cycle by the timer circuit. They are applied with stresses for the time period the same as the memory system without a timer circuit. Therefore, the test time can be reduced, the test method can be simplified, and defective memory cells can be easily removed.

Next, the third embodiment will be described. In the third embodiment, a normal operation is carried out within the ordinary use range (range of the rated power source voltage). When the power source voltage specific to a stress application test is used, the test mode different from the normal mode is effected to thereby apply sufficient stresses to memory cells during the test period.

Specifically, a power source voltage detector circuit is provided to a semiconductor memory. The semiconductor memory performs the normal operation if the power source voltage $V_{CC} < V_B$. If $V_{CC} > V_B$, all memory cell selection lines are selected at a time to enter the test mode different from the normal mode. $V_B$ represents a test mode setting potential which is outside the range of the ordinary rated operation voltage.

The third embodiment will be detailed with reference to the accompanying drawings.

Figure 8:
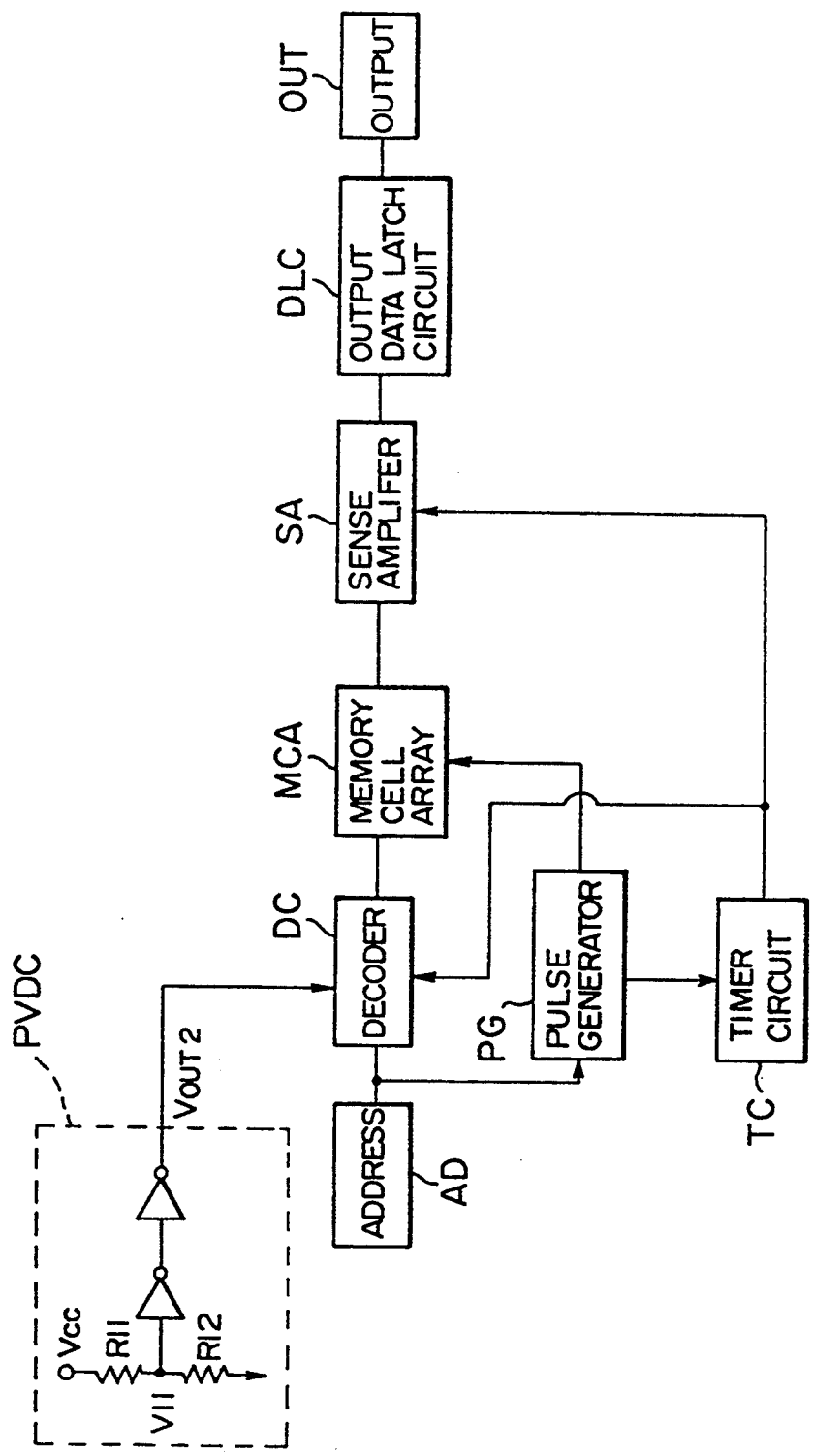
FIG. 8 shows a system arrangement of a third embodiment of the present invention.

FIG. 8 shows a simplified system arrangement of a static RAM during a read cycle. In FIG. 8, like elements to those shown in FIG. 4 are represented by identical reference numerals. When a power source voltage detector circuit PVDC detects that the power source voltage $V_{CC}$ is higher than a predetermined value $V_B$, it causes a decoder circuit DC to activate all word lines, and if the power source voltage $V_{CC}$ is smaller than $V_B$, its decoder circuit DC performs the normal operation.

Figure 9:
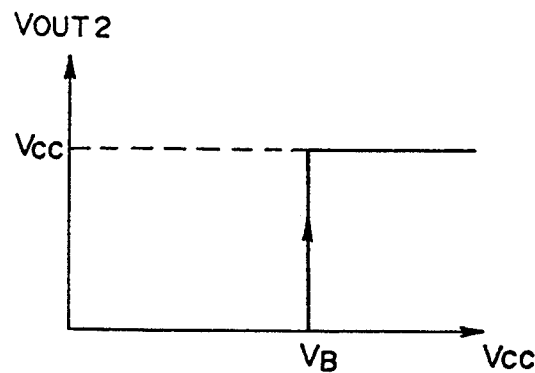
FIG. 9 is a graph showing the output characteristics of the power source voltage detector circuit shown in FIG. 8.

A voltage $V_{11}$ shown in FIG. 9 is determined by the resistance ratio of resistors $R_{11}$ and $R_{12}$. As seen from FIG. 9, if $V_{CC} < V_B$, an output $V_{OUT2}$ of the power source voltage detector circuit PVDC is $V_{OUT2} = 0$ V, and if $V_{CC} > V_B$, $V_{OUT2} = V_{CC}$. When the output $V_{OUT2} = 0$ V, all word lines WL0, WL1, ... are activated independently from addresses $A_0$, $NA_0$, $A_1$, $NA_1$. It is therefore possible to apply sufficient stresses to memory cells.

Figure 10:
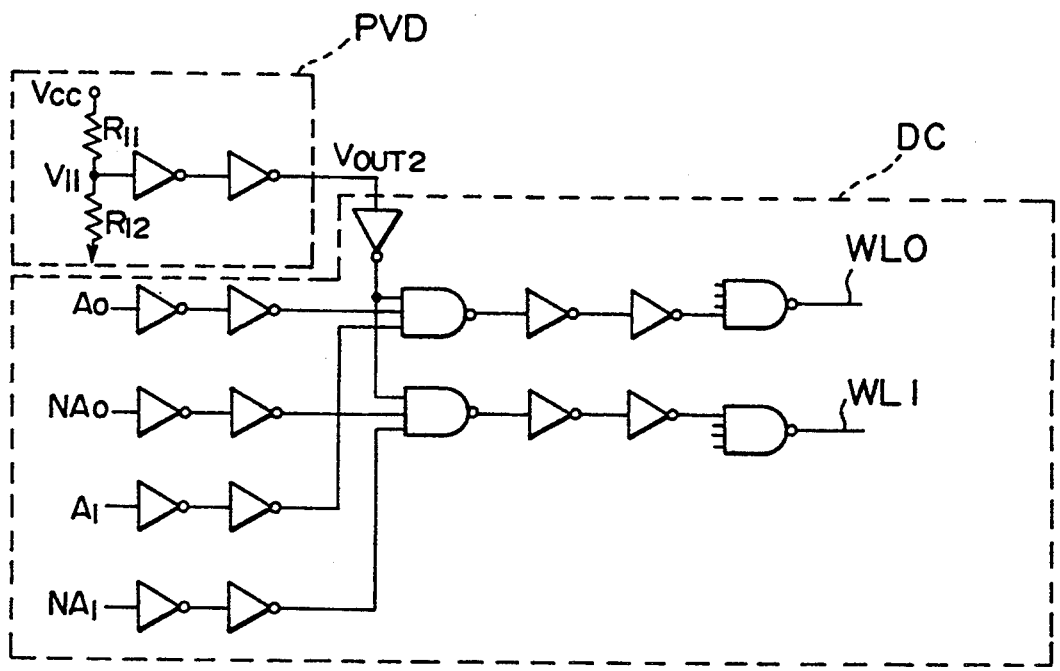
FIG. 10 is a detailed circuit showing part of the system shown in FIG. 8.

Specifically, as seen from FIG. 10, the decoder circuit DC is a circuit for selecting one of decode lines WL0, WL1, ... in accordance with an input address signal. The detector circuit output $V_{OUT2}$ is supplied to the decoder circuit DC. Logical operations between the output $V_{OUT2}$ and addresses $A_0$, $NA_0$, ... are carried out by the decoder circuit DC. Namely, the logical OR operations between the output $V_{OUT2}$ and addresses in the decoder circuit DC are carried out. If $V_{CC} < V_B$, the decoder circuit DC performs the normal operation as determined by the input address signal. If $V_{CC} > V_B$, all outputs of the decoder circuit DC take a constant potential independently from the input address signal to activate all decode lines WL0, WL1, ...

The logical operation by the decoder circuit DC may be an OR operation between the detector circuit output $V_{OUT2}$ and addresses in the decoder detector circuit.

In the case of an E/R static RAM using high resistance elements, these high resistance elements may be used as the divider resistors $R_{11}$ and $R_{12}$. Use of high resistance elements sufficiently lowers a leakage current between the power source and ground of the power source voltage detector circuit PVDC.

The voltage $V_{11}$ may be set by using transistors instead of divider resistors $R_{11}$ and $R_{12}$.

According to the third embodiment of the present invention described above, within the range of the ordinary rated power source voltage, the memory device performs its normal operation. If the power source voltage is in excess of the predetermined value, word lines of all memory cells can be selected at a time. Therefore, sufficient stresses can be applied to memory cells, the test time can be reduced, and the test method can be simplified, thereby reliably removing defective memory cells, improving the manufacturing yield and device reliability.

Next, the fourth embodiment will be described.

In this embodiment, depending upon the magnitude of the power source voltage, the operation of a time circuit is switched between the first and second operation states. In the first operation state, the normal mode is effected using ordinary control signals. In the second operation state, the timer circuit continuously outputs an activation signal independently from ordinary control signals. Namely, depending upon whether the power source voltage $V_B$ is larger or smaller than $V_{CC}$, the operation state of the timer circuit is switched between the first and second operation states. The voltage level $V_B$ for $V_{CC} > V_B$ is of outside the range of the ordinary rated power source voltage of the memory system. Namely, within the ordinary use range (range of the ordinary rated power source voltage), the timer circuit operates in a conventional manner with low power consumption. When a stress voltage is to be applied during a stress application test, selected memory cells are continuously activated during the test period, to thereby apply sufficient stresses.

The fourth embodiment of the present invention will be detailed with reference to the accompanying drawings.

Figure 11:
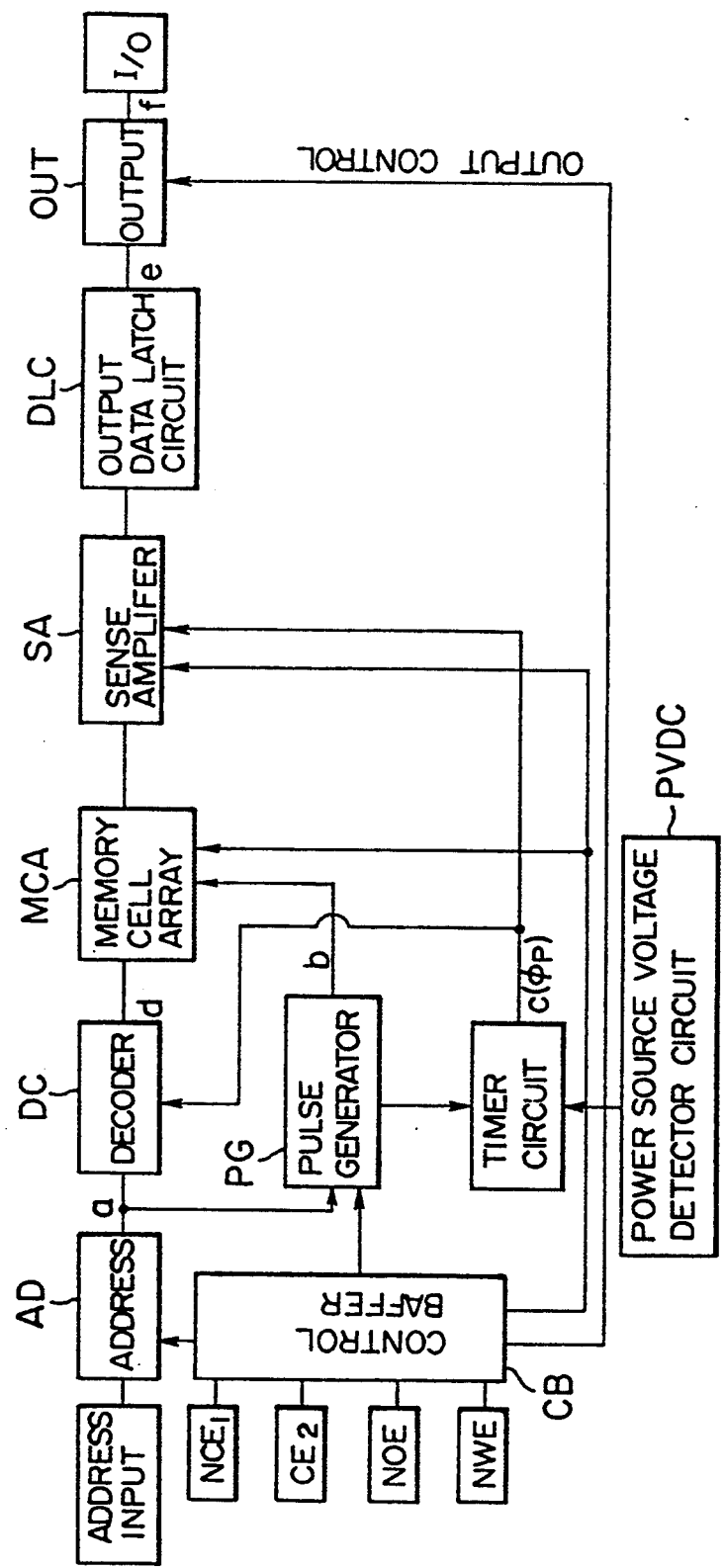
FIG. 11 shows a system arrangement of a fourth embodiment of the present invention.

FIG. 11 shows a system arrangement of the memory system during a read cycle. In FIG. 11, like elements to those shown in FIG. 4 are represented by using identical reference numerals. A different point from FIG. 4 is a provision of a power source voltage detector circuit PVDC in place of the voltage detector circuit VDC. If the power source voltage detector circuit PVDC detects that the voltage $V_{CC}$ is lower than a predetermined value $V_B$, the timer circuit TC operates in the normal mode, whereas if higher, it continuously outputs an activation signal to activate a memory cell array MCA and sense amplifier SA.

Figure 12:
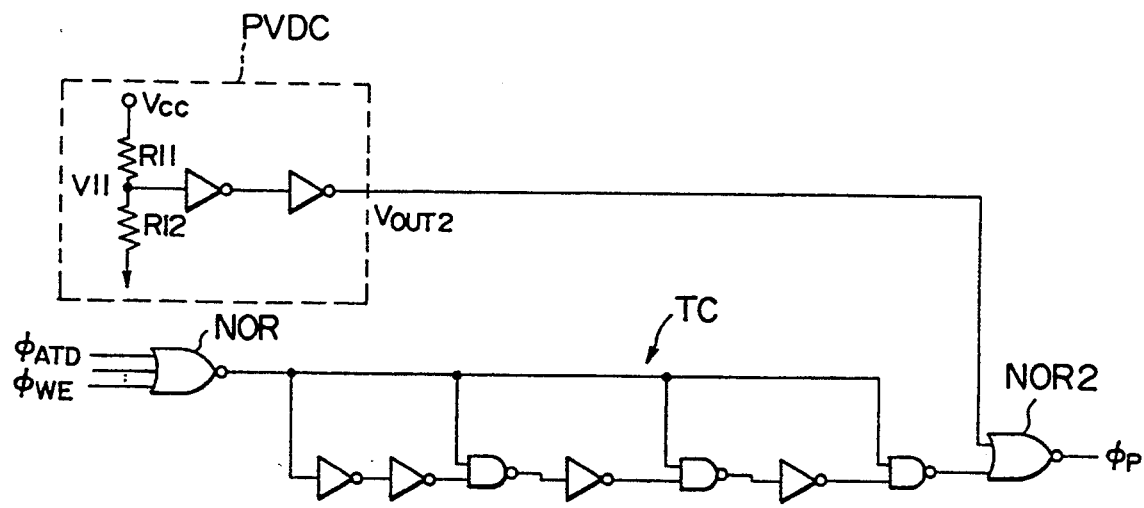
FIG. 12 is a detailed circuit showing part of the system shown in FIG. 11.

FIG. 12 is a detailed circuit diagram of the power source voltage detector circuit PVDC connected to the timer circuit TC. In FIG. 12, like elements to those shown in FIGS. 5 and 8 are represented by using identical reference numerals. The power source voltage detector circuit PVDC shown in FIG. 12 is the same as the power source voltage detector circuit PVDC shown in FIG. 8. The timer circuit TC shown in FIG. 12 is the same as the timer circuit TC shown in FIG. 5. Therefore, the circuit shown in FIG. 12 operates in the similar manner as described above. Specifically, if $V_{CC} < V_B$, the timer circuit TC performs the normal operation in accordance with inputted control signals $\phi_{ATD}$, $\phi_{WE}$ and the like. Namely, the decoder DC and sense amplifier SA are activated for a predetermined time period, and thereafter they are inactivated. If $V_{CC} > V_B$, the output $\phi_p$ of the timer circuit TC becomes an activation signal which continues to activate the decoder DC and sense amplifier SA during the operation cycle.

In the case of an E/R static RAM using high resistance elements, these high resistance elements may be used as divider resistors of the power source voltage detector circuit PVDC. Use of high resistance elements sufficiently lowers a leakage current between the input and ground of the power source voltage detector circuit PVDC.

The voltage $V_{11}$ may be set by using transistors instead of divider resistors. The logical operation between the outputs of the power source voltage detector circuit and the timer circuit may be made at the input side of the timer circuit. The logical OR operation, as well as the AND operation, may be used to obtain the same operational result.

According to the fourth embodiment of the present invention described above, within the range of the ordinary rated operation, low power consumption is possible by using the timer circuit like a conventional memory system. During a stress application test, selected memory cells are not activated for a predetermined period within an operation cycle by the timer circuit, but they are applied with stresses for the time period the same as the memory system without a timer circuit. Therefore, the test time can be reduced, the test method can be simplified, and defective memory cells can be easily removed.

Figure 13:
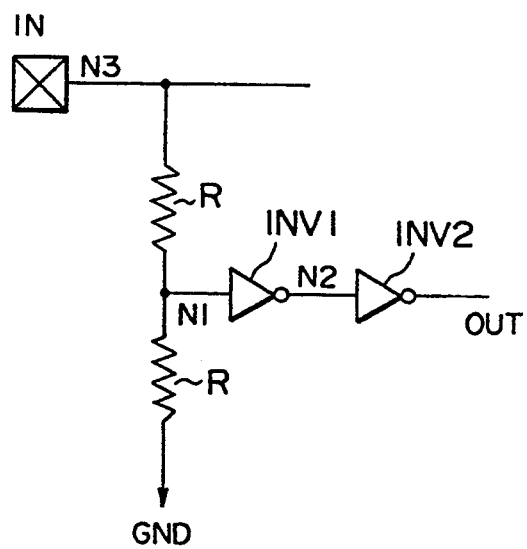
FIG. 13 is a circuit diagram of a detector circuit.

In the above embodiments, the input voltage detector circuit VDC and power source voltage detector circuit PVDC each are constructed of, as shown in FIG. 13, two voltage divider resistors R, R and two inverters INV, INV. However, instead of this configuration, the circuit shown in FIG. 16 may be used.

Figure 14:
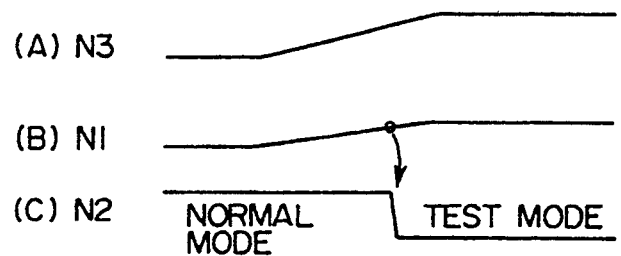
FIG. 14 is a timing chart explaining the operation of the detector circuit shown in FIG. 13.
Figure 15:
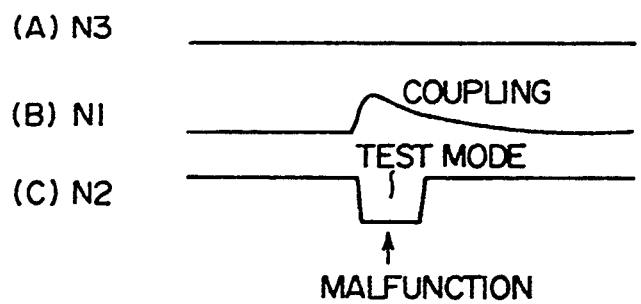
FIG. 15 is another timing chart explaining the operation of the detector circuit shown in FIG. 13.

In the circuit shown in FIG. 13, in order to meet the requirement of an input leakage current, the resistor R in the order of 10M ohms is used so that the node N1 is equivalent to the floating state and likely to raise its potential due to coupling or the like. The potential rise at the node N1 is erroneously detected by the inverter INV1 as a level "Hi". Therefore, the memory system enters the test mode although the test mode is not intended, resulting in a malfunction of the memory system. FIG. 14 shows the operation at the normal state, and FIG. 15 shows a false operation due to coupling.

Figure 16:
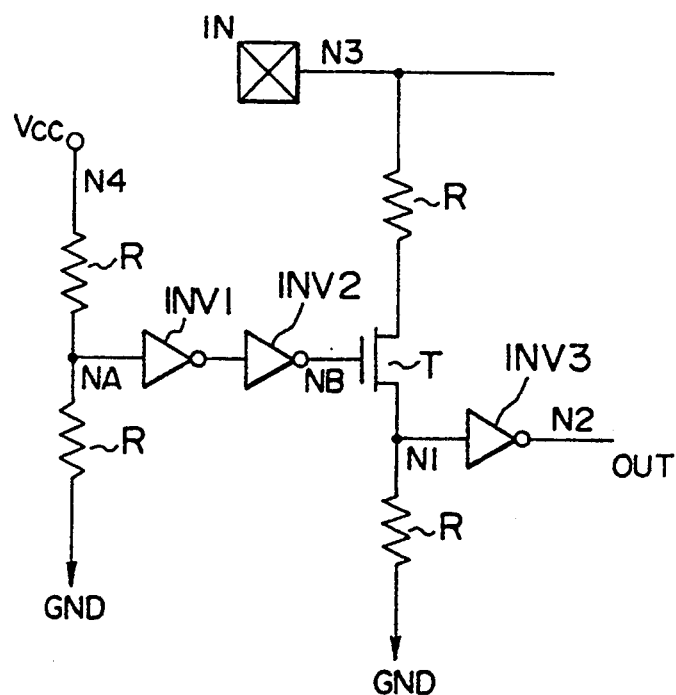
FIG. 16 is a circuit diagram of a fifth embodiment of the present invention.

However, if the circuit shown in FIG. 16 is used, there occurs no input leakage current and malfunction, within the range of the rated power source voltage.

In FIG. 16, resistors R and R are connected in series between the power source $V_{CC}$ and ground GND. The connection point (node NA) between two resistors is connected via inverters INV1 and INV2 to the gate of a transistor T. The drain of the transistor T is connected to an input terminal IN via a resistor R, and the source thereof is connected to ground via another resistor R. The source (node N1) of the transistor T is connected to an output terminal via an inverter INV3. The inverters INV1 and INV2 operate as part of the power source voltage detector circuit, and the inverter INV3 operates as part of the input voltage detector circuit. Each resistor R is in the order of several kilo-ohms.

The current flowing through each resistor R is in the order of mA, causing no malfunction.

Figure 17:
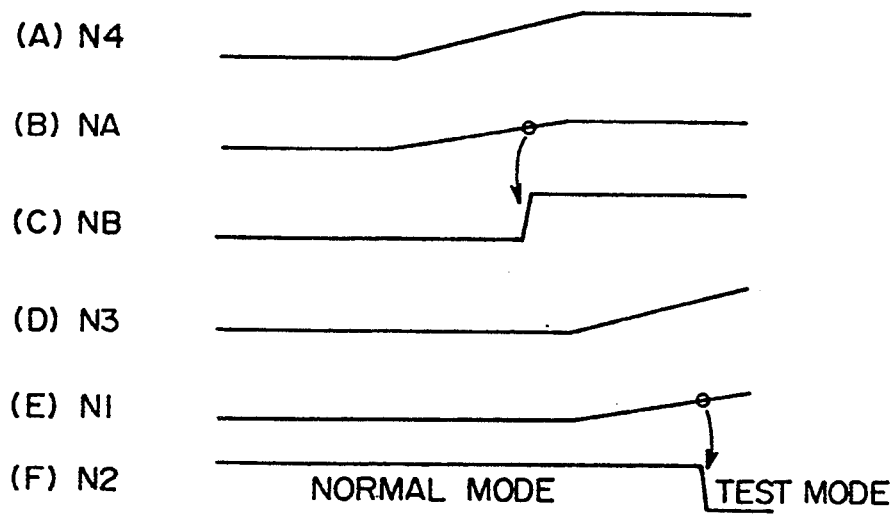
FIG. 17 is a timing chart explaining the operation of the circuit shown in FIG. 16.
Figure 18:
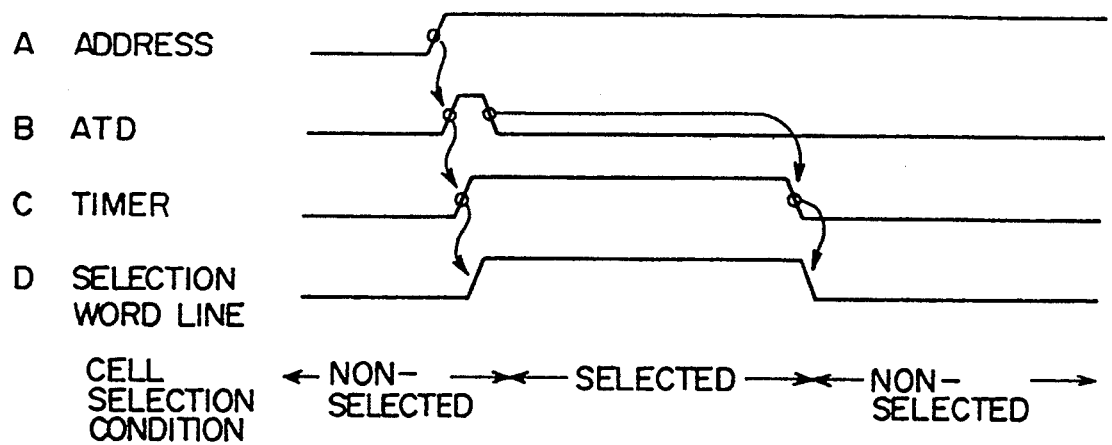
FIG. 18 is a timing chart explaining the operation of selecting a cell of a conventional memory.

When the power source voltage $V_{CC}$ reaches a predetermined potential or higher, the node NA between the two resistors R and R rises to such a level that an output of the inverter INV1 is reversed. Therefore, the node NB becomes "High". Then, the transistor T connected to this node NB becomes conductive. In this condition, when the potential at the input terminal IN rises to a predetermined level or higher, the potential at the node N1 rises to such a level that the output of the inverter INV3 is reversed. When the output of the inverter INV3 is reversed, the memory system receiving this output enters the test mode. The above operations are illustrated in FIG. 17.

Figure 22:
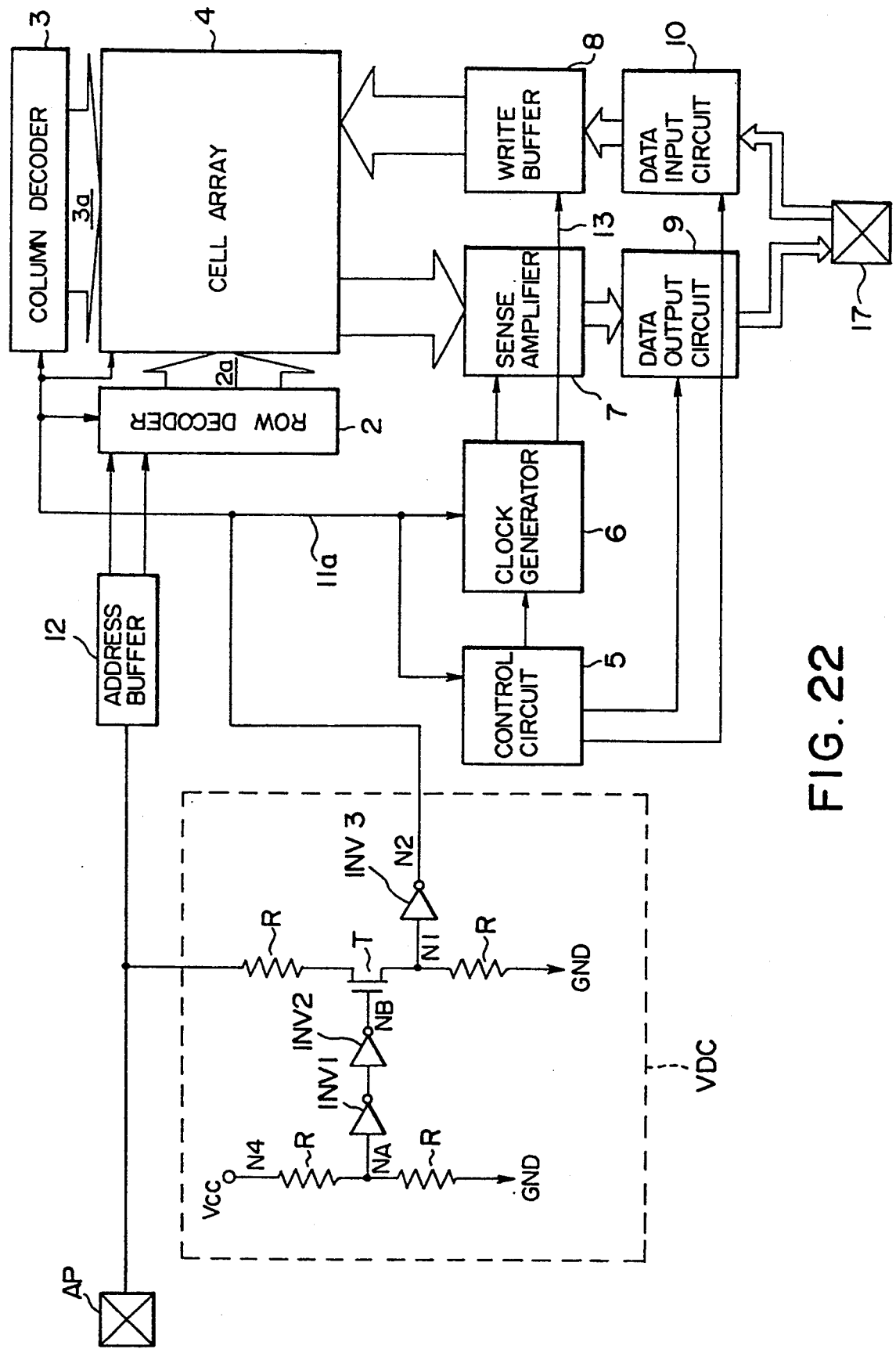
FIGS. 22 and 23 show system arrangements of other embodiments of the present invention.

In the circuits shown in FIGS. 1 and 5, the circuit shown in FIG. 16 may be used in place of the input voltage detector circuit VDC. Examples for this are shown in FIGS. 22 and 23.

Figure 23:
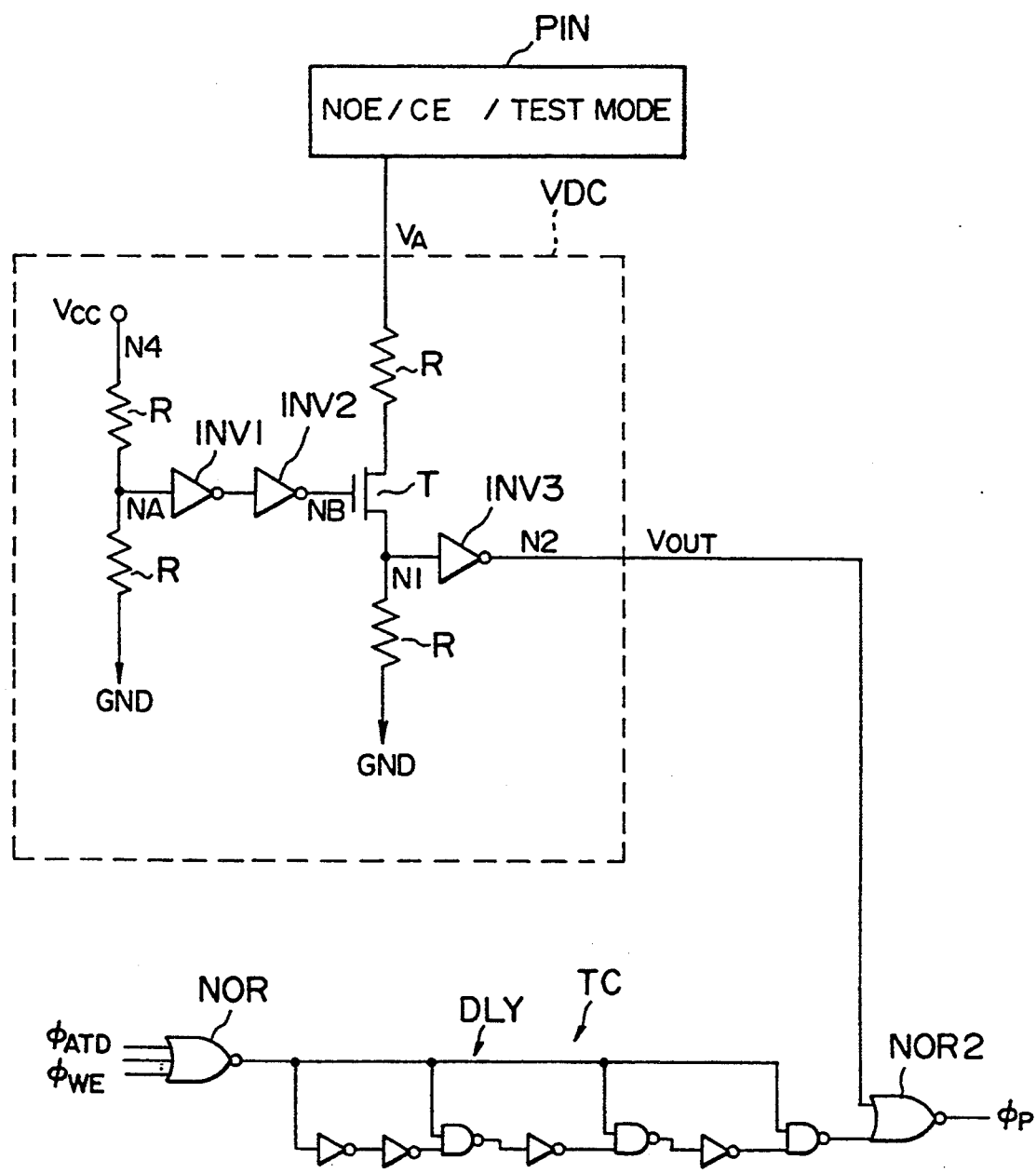

In FIG. 23, PIN represents one of an output enable pin, a positive logic chip enable pin, and a dedicated test mode signal application pin.

What is claimed is:

1. A SRAM having a normal mode of reading and writing data from and to selected memory cells in a memory cell array, comprising:
   detecting means connected to an input terminal for detecting a test mode signal applied to the input terminal and outputting a detection output signal for switching the normal mode to a test mode;
   a row decoder, a column decoder and the memory cell array responsive to the test mode to set all the memory cells to a selected status simultaneously;
   a control means having a control circuit responsive to the detection output signal for outputting a control output signal; and
   a clock generator responsive to the detection output signal and the control output signal, for generating an output signal to sense amplifiers and write buffers to enable data applied to the input terminal to be written simultaneously in all the memory cells set to the selectable status.

2. The SRAM of claim 1, wherein the input terminal is an address input terminal.

3. The SRAM of claim 1, wherein the input terminal is an input terminal for applying a test mode signal.

4. A semiconductor memory device having a normal mode of reading and writing data from and to selected memory cells of a memory cell array, comprising:
   timer means for outputting an activation signal activating the selected memory cells for a predetermined time period during the normal mode of reading and writing data; and
   control means for switching an operation mode to a test mode in response to a test mode signal applied to an input terminal and outputting the activation signal for continuously activating the memory cells while the test mode signal is being applied regardless of the operation of the timer means.

5. The semiconductor memory device of claim 4, wherein said control means includes detecting means for detecting the test mode signal applied to the input terminal and outputting a mode selection signal on the basis of the detected test mode signal.

6. The semiconductor memory device of claim 5, wherein the timer means obtains a logical result of a control output signal and the mode selection signal, to output the activation signal.

7. The semiconductor memory device of claim 4, wherein the input terminal is any one of an output enable pin, a positive logic chip enable and a test mode signal application pin.

8. The semiconductor memory device of claim 5, wherein the input terminal is any one of an output enable pin, a positive logic chip enable pin and a test mode signal application pin.

9. The semiconductor memory device of claim 6, wherein the input terminal is any one of an output enable pin, a positive logic chip enable pin and a test mode signal application pin.

10. A SRAM having a normal mode of reading and writing data from and to selected memory cells in a memory cell array, which comprises:
    detecting means for detecting a predetermined supply voltage level and outputting a detection output signal for switching the normal mode to a test mode, the output signal being applied to a row decoder, a column decoder and the memory cell array, in order to set all of the memory cells to a selectable status simultaneously;
    a control means having a control circuit responsive to the detection output signal, for outputting a control output signal;
    a clock generator responsive to the detection output signal and the control output signal, for generating an output signal to sense amplifiers and write buffers to enable data applied to the input terminal to be written simultaneously in all the memory cells set to the selectable status.

11. The SRAM of claim 10, which further comprises voltage dividing means for dividing the supply voltage.

12. The SRAM of claim 11, wherein said voltage dividing means is composed of resistance elements or active elements.

13. The SRAM of claim 10, wherein in the test mode, the output of the decoder selects all the memory cells simultaneously.

14. The SRAM of claim 11, wherein in the test mode, the output of the decoder selects all the memory cells simultaneously.

15. The SRAM of claim 12, wherein in the test mode, the output of the decoder selects all the memory cells simultaneously.

16. A semiconductor memory device having a normal mode for reading and writing data from and to selected and activated memory cells in a memory cell array for a time period predetermined by a timer means, comprising:
    control means for switching an operation mode to a test mode, when a supply voltage is higher than a predetermined value, and outputting an output of the timer means as an activation signal for activating the memory cell continuously when the supply voltage is higher than the predetermined value.

17. The semiconductor memory device of claim 16, which further comprises a detecting means for detecting whether the supply voltage is higher than the predetermined value.

18. The semiconductor memory device of claim 17, which further comprises voltage dividing means for dividing the supply voltage.

19. The semiconductor memory device of claim 18, wherein said voltage dividing means is composed of resistance elements or active elements.

20. A semiconductor memory device having a normal mode for reading and writing data from and to selected memory cells in a memory cell array, comprising:
    control means operative in response to a test mode signal applied to an input terminal, for switching an operation mode to a test mode, thereby simultaneously setting all the memory cells to be selected in the memory cell array into a selectable status, and writing data applied to a data input terminal to all the selected memory cells simultaneously,
    said control means including detecting means for detecting whether the test mode signal is applied to the input terminal, and having:
    first and second low resistance elements both connected in series between a high supply voltage and a low supply voltage;
    a third low resistance element, a switching element and a fourth low resistance element all connected in series between an input terminal and the low supply voltage;
    a connection circuit for connecting a junction point between said first and second low resistance elements and said switching element; and
    an output circuit connected to a junction point between said switching element and said fourth low resistance element.

21. A semiconductor memory device having a normal mode of reading and writing data from and to selected and activated memory cells in a memory cell array for a time period determined by timer means, comprising:
    control means, operative in response to a test mode signal applied to an input terminal, for switching an operation mode to a test mode and outputting an output of the timer means as an activation signal for activating the memory cells continuously when the test mode signal is being applied; and
    said control means including detecting means for detecting whether the test mode signal is applied to the input terminal and outputting a mode switching signal, the detecting means having:
    first and second low resistance elements both connected in series between a high supply voltage and a low supply voltage;
    a third low resistance element, a switching element and a fourth low resistance element, connected in series between an input terminal and the low supply voltage;
    a connection circuit for connecting a junction point between said first and second low resistance elements and said switching element; and
    an output circuit connected to a junction point between said switching element and said fourth low resistance element.

22. The semiconductor memory device of claim 20, wherein the input terminal is an address input terminal.

23. The semiconductor memory device of claim 20, wherein the input terminal is an input terminal for applying the test mode signal.

24. The semiconductor memory device of claim 21, wherein the timer means obtains a logical result of a control output signal and the mode switching signal to output the activation signal.

25. The semiconductor memory device of claim 22, wherein the input terminal is any one of an output enable pin, a positive logic chip enable pin and a test mode signal application pin.

26. A SRAM having a normal mode of reading and writing data from and to selected memory cells in a memory cell array, which comprises:

detecting means connected to an input terminal, for detecting a test mode signal applied to the input terminal and outputting a detection output signal for switching the normal mode to a test mode, thereby applying the test mode signal to a row decoder, a column decoder and the memory cell array so that all the memory cells are simultaneously set to a selectable status; and control means having a control circuit, for enabling data applied to a data input terminal to be written simultaneously in all the memory cells set to the selectable status.

27. A SRAM having a normal mode of reading and writing data from and to selected memory cells in a memory cell array, comprising:

detecting means for detecting a predetermined supply voltage level and outputting a detection output signal for switching from the normal mode to a test mode, thereby applying the output signal to a row decoder, a column decoder and the memory cell array, so that all the memory cells are simultaneously set to a selectable status;

control means having a control circuit responsive to the detection output signal, for outputting a control output signal; and a clock generator responsive to the detection output signal and the control output signal, for generating an output signal to sense amplifiers and write buffers to enable data applied to the input terminal to be written simultaneously in all of the memory cells set to the selectable status.

* * * * *